(12) United States Patent
Dastidar et al.

(10) Patent No.: US 8,004,915 B1
(45) Date of Patent: Aug. 23, 2011

(54) AREA-EFFICIENT MEMORY BUILT-IN-SELF-TEST CIRCUITRY WITH ADVANCED DEBUG CAPABILITIES FOR DISTRIBUTED MEMORY BLOCKS

(75) Inventors: Jayabrata Ghosh Dastidar, Santa Clara, CA (US); Danh Dang, Hayward, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/463,358

(22) Filed: May 8, 2009

(51) Int. Cl.
*G11C 7/00* (2006.01)
(52) U.S. Cl. ............... 365/201; 365/230.03; 365/230.08
(58) Field of Classification Search .................. 365/201, 365/230.03, 230.08
See application file for complete search history.

(56) References Cited

U.S. PATENT DOCUMENTS

| | | | |
|---|---|---|---|
| 6,910,155 B2 | 6/2005 | Ku | |
| 7,017,094 B2 | 3/2006 | Correale | |
| 7,188,274 B2 | 3/2007 | Nadeau-Dostie | |
| 7,266,028 B1 | 9/2007 | Ghosh Dastidar | |
| 2003/0063517 A1* | 4/2003 | Jain | 365/230.05 |
| 2009/0116321 A1* | 5/2009 | Shirur et al. | 365/201 |

* cited by examiner

*Primary Examiner* — Hoai V Ho
(74) *Attorney, Agent, or Firm* — Treyz Law Group; G. Victor Treyz; Jason Tsai

(57) ABSTRACT

An integrated circuit is provided with built-in-self test circuitry. The integrated circuit may have multiple blocks of memory. The memory may be tested using the built-in-self test circuitry. Each memory block may include a satellite address generator that is used in generating test addresses for the memory blocks. Each memory block may also include failure analysis logic and output response analyzer logic. Stalling logic may be used to individually stall memory block testing on a block-by-block basis during memory tests. Address buffer circuitry such as first-in-first-out buffers may be used to provide randomized memory addresses during testing.

20 Claims, 11 Drawing Sheets

AREA-EFFICIENT MEMORY BUILT-IN-SELF-TEST CIRCUITRY WITH ADVANCED DEBUG CAPABILITIES FOR DISTRIBUTED MEMORY BLOCKS

BACKGROUND

This invention relates to testing memory circuits, and more particularly, to testing integrated circuit memory blocks using built-in-self-test circuitry.

Memory blocks are often fabricated as part of modern integrated circuits. For example, application-specific integrated circuits and programmable integrated circuits such as programmable logic device integrated circuits may contain memory blocks.

Memory blocks may be provided in the form of arrays of random-access memory (RAM) cells. The memory blocks are used to handle the storage needs of the circuitry on a given integrated circuit. During normal operation of the integrated circuit, read and write operations are performed on the memory blocks.

Memory blocks on a programmable logic device are sometimes referred to as embedded array blocks (EABs) and may range in size from a few kilobits to about a megabit or more.

To ensure satisfactory operation of an integrated circuit that contains memory blocks, the memory blocks are generally tested during debug and design operations. Testing may also be performed during manufacturing.

It can be cumbersome or impossible to perform high-speed memory tests using only external test equipment. It is therefore often desirable to include internal test support circuitry on an integrated circuit to facilitate memory block tests. Because the internal test circuitry is incorporated into the integrated circuit that is to be tested, this type of test circuitry is sometimes referred to as built-in-self-test (BIST) circuitry.

A memory block built-in-self-test circuit supplies a memory block with test data while systematically stepping through the addresses for the memory block. If an unexpected result is detected in response to certain test data, the built-in-self-test circuitry can conclude that the memory block contains an error. Appropriate debugging or manufacturing repair operations may then be performed.

Conventional BIST architectures are satisfactory in certain situations, but can be inefficient when scaled to handle multiple memory blocks. For example, many conventional BIST circuits centralize address generation functions. Although this type of arrangement conserves address generation circuit resources, it places a burden on the address signal routing resources that are used on the integrated circuit. As a result, the area and complexity savings that might be obtained by centralizing address generation functions are offset by the numerous address distribution lines that are needed to distribute the centrally generated address.

It would therefore be desirable to be able to provide enhanced memory block built-in-self-test circuitry for testing memory blocks on an integrated circuit.

SUMMARY

An integrated circuit is provided with built-in-self test circuitry. The integrated circuit may have multiple blocks of memory. During normal operation of the integrated circuit, the memory blocks may be used in storing data for processing circuits.

During manufacturing, some memory blocks may be produced with faults. Testing can be performed to detect these faults before the integrated circuit is put into use.

Memory block testing may be performed by using built-in-self-test circuitry that is included on the integrated circuit. Each memory block may include a satellite address generator that is used in generating test addresses for the memory blocks. Each memory block may also include failure analysis logic and output response analyzer logic. Stalling logic may be used to individually stall memory blocks under test on a block-by-block basis during memory tests to facilitate debug or failure analysis data collection. Address buffer circuitry such as first-in-first-out buffers may be used to provide randomized memory addresses during testing. The address buffer circuitry may be incorporated into the built-in-self-test circuitry or may be provided in the memory blocks. The randomized memory addresses that are produced by the first-in-first-out buffers allow memory tests to be performed using patterns of test addresses that might otherwise be difficult or impossible to generated using built-in-self-test circuitry, thereby facilitating low cost advanced debug operations.

Further features of the invention, its nature and various advantages will be more apparent from the accompanying drawings and the following detailed description of the preferred embodiments.

DETAILED DESCRIPTION

The present invention relates to testing memory on integrated circuits. Memory may be provided in blocks (sometimes referred to as arrays) on an integrated circuit. Examples of integrated circuits that may include blocks of memory to be tested include application-specific integrated circuits, digital signal processors, memory chips, microcontrollers and microprocessors, audio and video chips with memory arrays, and programmable integrated circuits. Programmable integrated circuits with memory blocks may include programmable logic devices (sometimes referred to as field-programmable gate arrays) and programmable integrated circuits of the type that not traditionally referred to as programmable logic devices such as microprocessors containing programmable logic, digital signal processors containing programmable logic, custom integrated circuits containing regions of programmable logic, or other programmable integrated circuits that contain programmable logic and one or more memory blocks. The present invention is sometimes described in the context of programmable integrated circuits such as programmable logic device integrated circuits as an example. This is, however, merely illustrative. Any integrated circuit can be provided with memory built-in-self test circuitry if desired. The integrated circuits that are tested with the memory built-in-self test circuitry need not be of a particular type. For example, it is not necessary that the integrated circuits be field-programmable gate arrays. The integrated circuits can be other types of circuits if desired.

Figure 1:
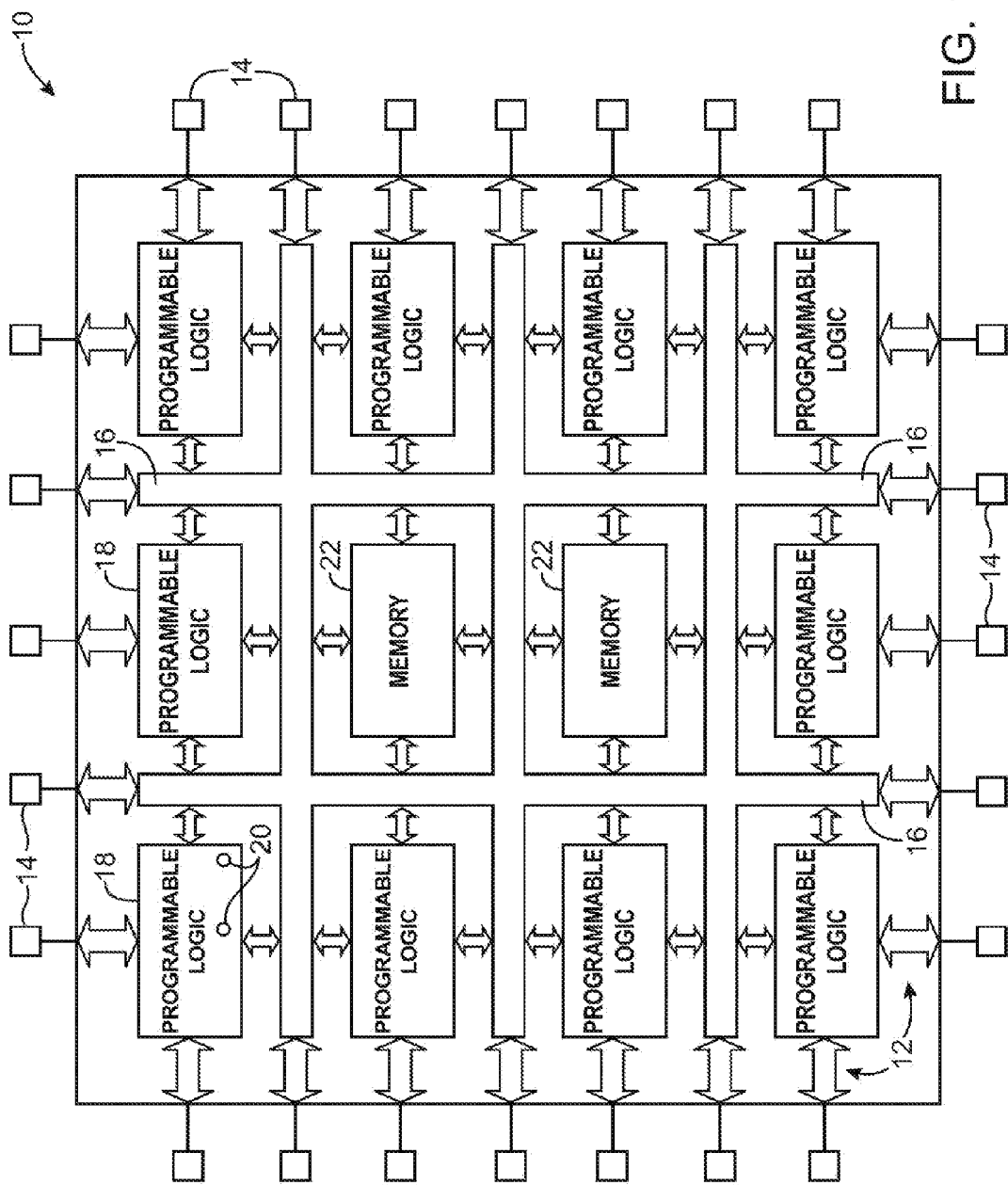
FIG. 1 is a diagram of an illustrative integrated circuit such as a programmable integrated circuit that may contain built-in-self-test circuitry for testing memory blocks in accordance with an embodiment of the present invention.

An illustrative integrated circuit with memory blocks that may be tested using built-in-self-test circuitry is shown in FIG. 1. Integrated circuit 10 may be, as an example, a programmable integrated circuit such as a programmable logic device integrated circuit.

As shown in FIG. 1, device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 may include conductive line and programmable connections between respective conductive lines and may therefore sometimes be referred to as programmable interconnects 16.

Integrated circuit 10 may contain hardwired circuitry (e.g., for implementing multipliers, communications functions, dedicated signal processing functions, etc.). Integrated circuit 10 may also contain programmable logic 18 and memory blocks 22.

Programmable logic 18 may include combinational and sequential logic circuitry and may be configured to perform a custom logic function. Programmable interconnects 16 may also be considered to be a type of programmable logic.

Device 10 may contain programmable memory elements 20. Memory elements 20 can be loaded with configuration data (also called programming data) using pins 14 and input/output circuitry 12. Once loaded, the memory elements each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory or configuration RAM.

Memory blocks 22 contain arrays of volatile memory elements such as random-access-memory (RAM) cells. In a typical arrangement, memory blocks 22 are implemented using dual-port RAM arrays. With this type of configuration, data may be accessed using first and second data ports.

Memory blocks 22 can be used to store data signals during normal operation of device 10. Memory blocks 22 need not all be the same size. For example, small, medium, and large memory blocks 22 may be included on the same integrated circuit. There may, for example, be thousands of small memory blocks each having a capacity of about 640 bits, up to one hundred large memory blocks each having a capacity of about 144 kilobits, and an intermediate number of medium size memory blocks each having a capacity of about 9 kilobits. These are merely illustrative memory block sizes and quantities. In general, there may be any suitable size and number of memory blocks 22 on device 10. There may also be any suitable number of regions of programmable logic 18.

During normal use in a system, memory elements 20 are generally loaded with configuration data from a configuration device integrated circuit via pins 14 and input/output circuitry 12. The outputs of the loaded memory elements 20 are applied to the gates of programmable logic components such as metal-oxide-semiconductor transistors in programmable logic 18 to turn certain transistors on or off and thereby configure the logic in programmable logic 18. Programmable logic circuit elements that may be controlled in this way include pass transistors, parts of multiplexers (e.g., multiplexers used for forming routing paths in programmable interconnects 16), look-up tables, logic arrays, AND, OR, NAND, and NOR logic gates, etc.

During programmable logic testing, test configuration data and test vectors may be supplied to device 10 from a tester. A tester may also be used to supply test data to device 10 in support of memory block testing. For example, a tester or other equipment may provide test information to built-in-self-test circuitry on device 10 that built-in-self-test circuitry can use in determining what type of testing is to be performed on memory blocks 22.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

Memory block built-in-self-test circuitry may be formed using hardwired and "soft" circuit arrangements. In a typical hardwired arrangement, the built-in-self-test circuitry is designed in advance and is fabricated as part of the integrated circuit. In "soft" built-in-self-test circuits, the built-in-self-test circuitry is implemented by programming device 10 with appropriate configuration data. The configuration data configures resources in programmable logic 18 to implement the built-in-self-test circuitry. If desired, part of a built-in-self-test circuit may be implemented using hardwired circuitry and part of the built-in-self-test circuit may be implemented using programmable logic. An advantage of forming memory block built-in-self-test circuitry at least partly from programmable logic is that this allows the programmable logic to be reprogrammed for use in implementing a user's logic design once testing is complete.

During testing, the built-in-self-test circuitry on device 10 generates test signals for a memory block under test. Signal lines are used to route signals between the built-in-self-test circuitry and the memory being tested. In a typical configuration, multiple blocks of memory can be tested at once to improve test efficiency. Memory test results can be analyzed on the programmable logic device or other integrated circuit that is being tested using on-chip resources (sometimes referred to as output response analyzer circuitry). Memory test results can also be analyzed off chip.

Figure 2:
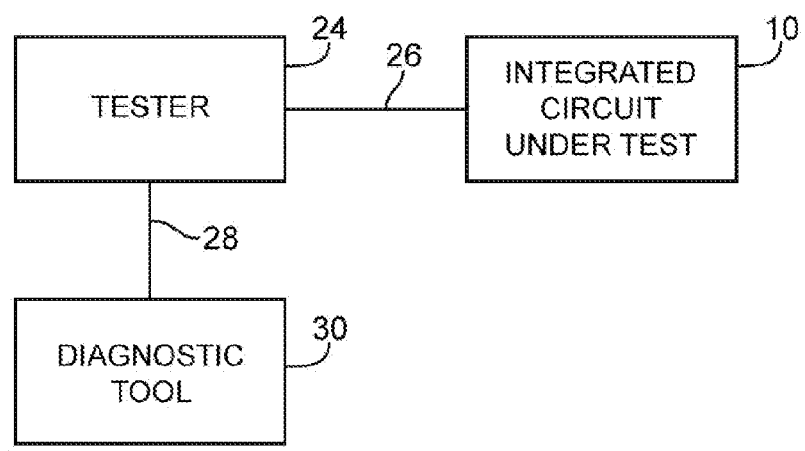
FIG. 2 is a diagram of an illustrative test environment in which an integrated circuit with memory blocks such as a programmable integrated circuit with memory blocks may be tested using external test equipment and memory block built-in-self-test circuitry in accordance with an embodiment of the present invention.

A system environment of the type that may be used during test operations is shown in FIG. 2. A programmable logic device integrated circuit 10 or other integrated circuit under test may be connected to a tester 24 using test path 26. The device being tested, which is sometimes referred to as the device under test, may be an unpackaged integrated circuit such as a circuit in an undiced wafer or may be a packaged integrated circuit. Tester 24 may have an appropriate test fixture for making electrical connections with the pins 14 of device 10 during testing.

To perform a test, tester 24 can apply power to device 10 through power pins. Test configuration data can then be loaded into configuration memory 20 in device 10 through path 26 (if device 10 is a programmable integrated circuit). The configuration data can be used to configure a programmable logic device for testing. For example, the configuration data may be used to implement all or part of a memory block built-in-self-test circuit and may be used to configure programmable interconnects on the device to form signal routing paths that are used in routing test data to and from the memory block circuitry to be tested. As tests are performed, test data may be generated on device 10. For example, the built-in-self-test circuitry may generate address, data, and control signals for applying to memory blocks 22.

Device 10 and the built-in-self-test circuitry may also use internal circuitry to perform test analysis operations. For example, device 10 may be programmed to implement a comparator that compares expected test data to test data read from a memory block under test. By comparing the memory data that has been read from the memory block to the expected data, the comparator can determine which bits of the memory block are not performing properly. Test analysis may also be performed externally. For example, test data can be provided to a diagnostic tool 30 via path 26, tester 24, and path 28. Tools such as tester 24 and tool 30 are typically implemented using computing equipment such as computers loaded with testing software.

Tests may be run at any suitable clock speed. Some types of tests are preferably run at speed. At-speed tests are performed at a normal clock speed or at a speed that is at least sufficient to ensure that the memory faults that are likely to be encountered during normal use are exercised. The minimum clock speed that is required to fully exercise memory block faults is sometimes referred to as a "functional" clock speed. With one suitable approach, testing can be performed at the highest clock speed allowed when operating the memory normally in a system. Testing at the highest normal clock speed is sometimes preferred, because elevated speeds reveal faults that might not appear at slower clock speeds.

Figure 3:
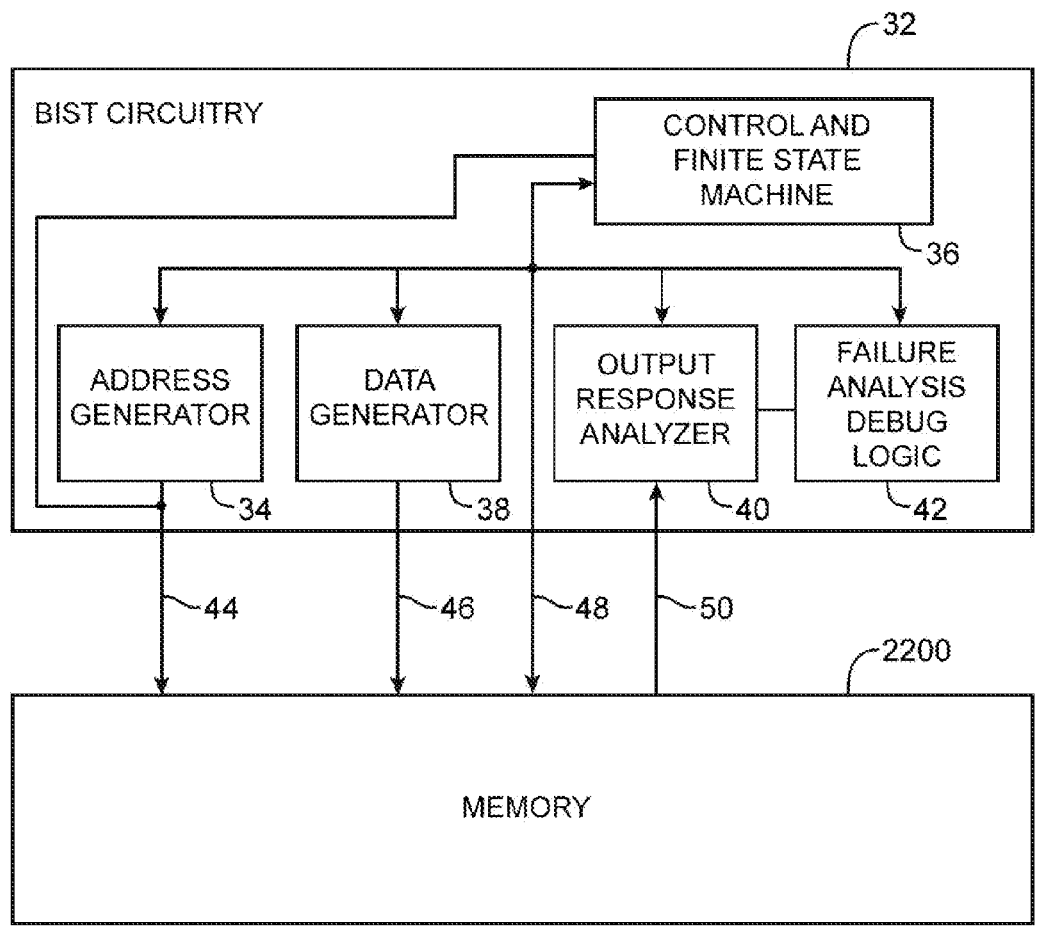
FIG. 3 is a diagram of a conventional built-in-self-test circuit that can be used to test a block of memory on a programmable logic device integrated circuit.

A conventional built-in-self-test circuit arrangement that may be used in testing a memory block is shown in FIG. 3. As shown in FIG. 3, built-in-self-test circuitry 32 may be using in testing memory block 2200. Built-in-self-test circuitry 32 may include control logic that is used in controlling test operations. This control logic is shown schematically as control and finite state machine circuit 36 in FIG. 3. Control circuitry 36 may be coupled to testing resources in built-in-self-test circuitry 32 and memory 2200. In a typical test, control circuit 36 directs address generator 34 to systematically generate a series of addresses for addressing memory 2200. Control circuitry 36 also directs data generator 38 to generate test data. In response, address generator 34 supplies addresses to memory block 2200 over address path 44 while the test data generated by data generator 38 is being supplied to memory 2200 over test data path 46. The addresses on path 44 may be undecoded N-bit addresses (e.g., 8-bit addresses) that are decoded by address decoder circuitry in memory block 2200. Control signal path 48 can be used to convey control signals (e.g., read/write enable signals, etc.) from control circuit 36 to memory block 2200. Corresponding test results may be conveyed back from memory block 2200 to output response analyzer 40 in built-in-self-test circuitry 32 using path 50. Path 50 may be, for example, a 16-bit data path. Output response analyzer 40 and failure analysis debug logic 42 may process the data that is received from memory 2200 and may produce corresponding test results information for built-in-self-test circuitry 32. Circuitry such as the circuitry of FIG. 3 has been implemented in soft-BIST arrangements in programmable logic devices and in hardwired circuitry in application-specific integrated circuits.

To ensure that testing is performed properly during the relatively high clock speeds associated with at-speed tests, the signal paths between memory block 2200 and built-in-self-test circuitry 32 may be formed using robust signal lines. These signal paths may employ relatively large conductive lines and buffers to ensure that high speed signals can be conveyed successfully.

Although arrangements of the type shown in FIG. 3 can be satisfactory in configurations where a built-in-self-test circuit is used in testing an individual block of memory 2200, arrangements of the type shown in FIG. 3 present difficulties when testing more memory.

Figure 4:
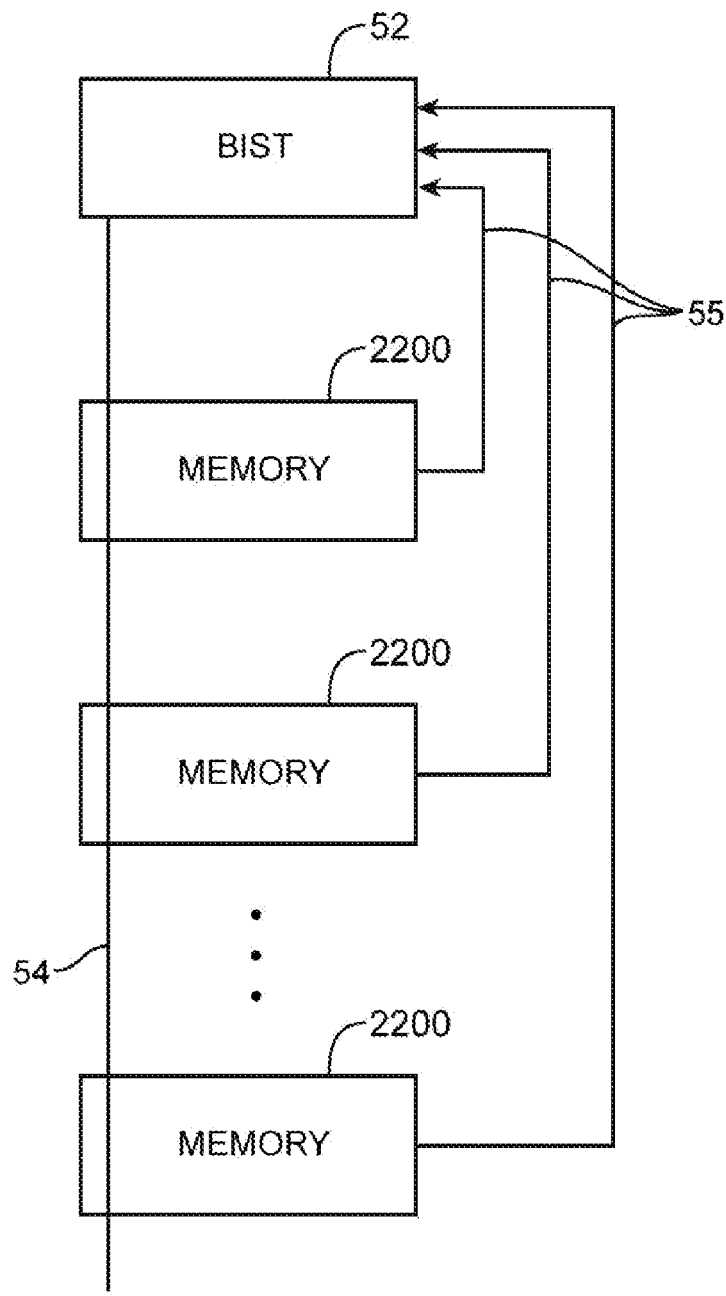
FIG. 4 is a diagram of conventional built-in-self-test circuitry of the type that may be used to test multiple memory blocks.

A conventional arrangement for using built-in-self-test circuitry to handle tests for multiple blocks of memory is shown in FIG. 4. As shown in FIG. 4, built-in-self-test block 52 distributes address, data, and control signals of the type carried over paths 44, 46, and 48 of FIG. 3 to multiple memory blocks 2200 using path 54. Individual return paths 55 are used to convey signals back to built-in-self-test circuit bock 52 from each memory block 2200 (as with path 50 of FIG. 3).

In the conventional arrangement of FIG. 4, path 54 must include numerous high speed lines for carrying decoded address signals, data signals, and control signals. As a result, path 54 typically consumes a relatively large amount of integrated circuit area. Even though there is some area savings in using a single built-in-self-test circuit block such as block 52 to perform tests on multiple memory blocks 2200, these savings may be offset by the large amount of area consumed by paths 54 and 55.

Figure 5:
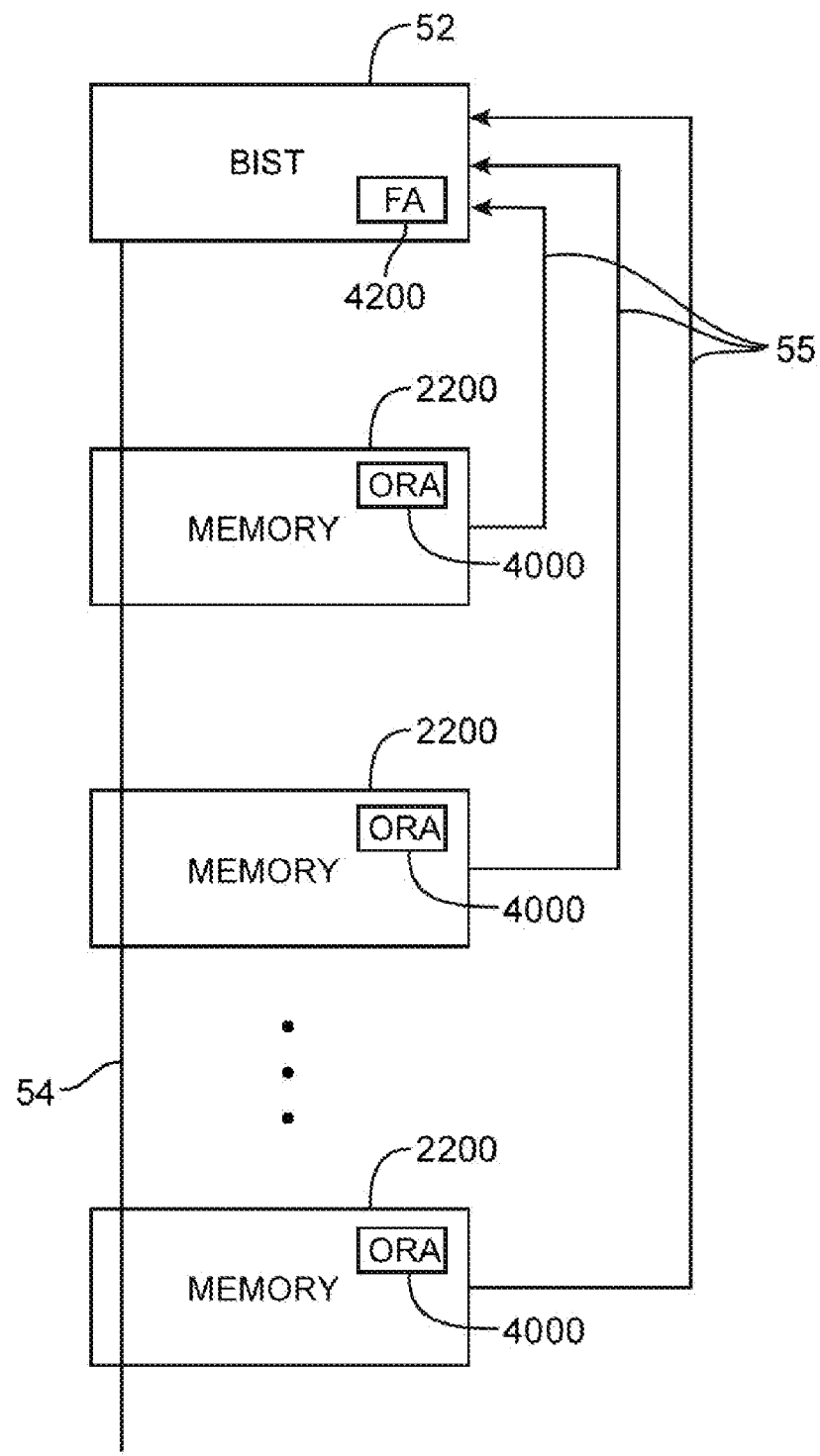
FIG. 5 is another diagram of conventional built-in-self-test circuitry of the type that may be used to test multiple memory blocks.

Another conventional arrangement for sharing a built-in-self-test circuit among multiple memory blocks is shown in FIG. 5. As shown in FIG. 5, built-in-self-test circuit block 52 may distribute undecoded address signals, data signals, and control signals to memory blocks 2200 using bus 54. Each memory block 2200 may be provided with its own output response analyzer 4000. This allows each memory block 2200 to perform error analysis before providing error information to failure analysis debug logic 4200 in built-in-self-test circuit 52. The size of path 54 is still large in this type of configuration, but the amount of resources used to implement paths 55 of FIG. 5 can be reduced relative to paths 55 of FIG. 4.

Figure 6:
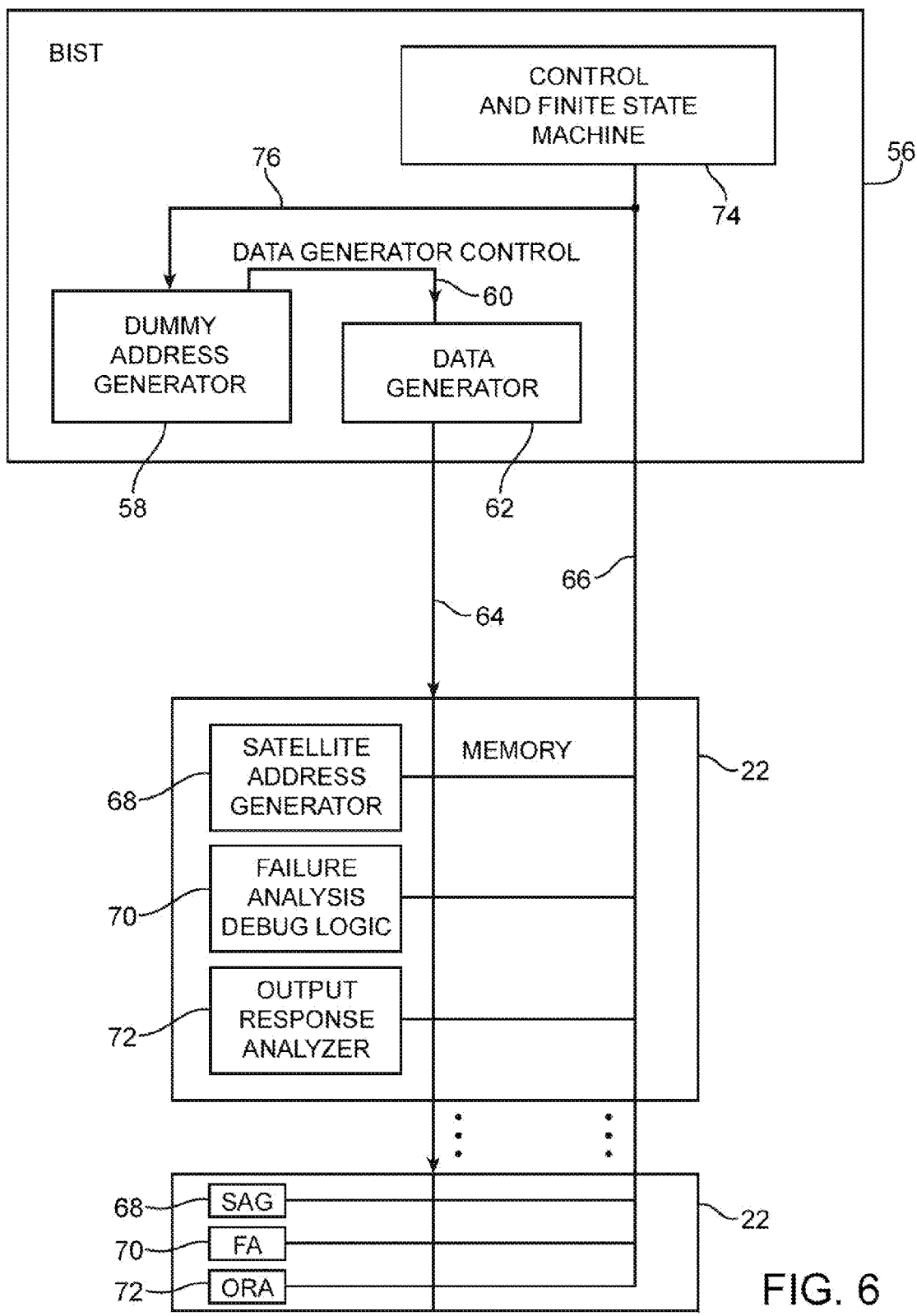
FIG. 6 is a circuit diagram of built-in-self-test circuitry that may be used in testing multiple blocks of memory on an integrated circuit such as a programmable integrated circuit in accordance with an embodiment of the present invention.

An illustrative built-in-self-test circuit arrangement that helps overcome signal distribution problems of the type described in connection with the conventional arrangements of FIGS. 4 and 5 is shown in FIG. 6. As shown in FIG. 6, memory blocks 22 may each be provided with a satellite address generator 68. Each satellite address generator may locally generate the address signals to be used in testing the memory block in which that satellite address generator is located. Because addresses are generated locally in this way, it is not necessary to provide a large signal bus between built-in-self-test block 56 and each memory block 22 to accommodate addresses from built-in-self-test block 56.

As shown in FIG. 6, built-in-self-test circuit 56 may have a dummy address generator such as dummy address generator 58. Dummy address generator 58 may communicate with circuitry in BIST 56 such as control and finite state machine 74 (using path 76) and data generator 62 (using path 60). Paths such as paths 76 and 60 may be bidirectional if desired.

Dummy address generator 58 may generate data generator control signals that are provided to data generator 62 over data generator control path 60. The data generator control signals are generally less complex than a full undecoded binary address of the type normally generated by a built-in-self-test address generator. For example, the least significant bit of a column counter value and the least significant bit of a row counter value may serve as the data generator control signals that dummy address generator 58 provides to data generator 62.

In response to the received data generator control signals, data generator 62 generates test data for memory blocks 22. The test data from data generator 62 may be distributed to memory blocks 22 using test data bus 64.

Each memory block 22 may have a block of failure analysis (FA) and debug logic 70 and an output response analyzer (ORA) 72. Failure analysis circuitry 70 may aid in performing debugging operations (e.g., to identify which bit of a memory has failed by its address, which type of failure occurred—i.e., stuck at "0," stuck at "1," failed to read a "0," failed to read a "1," etc.). Circuits 70 and 72 may provide test results data to built-in-self-test circuitry 56 using path 66. Path 66 may also be used to handle control signals for circuitry in the memory blocks such as satellite address generators 68. For example, control circuitry 74 in built-in-self-test circuitry 56 may supply each satellite address generator 68 with satellite address generator control signals such as clear control signals (e.g., a signal RESET to reset an address counter in the satellite address generator and thereby clear the address being generated), enable control signals (e.g., a signal ENABLE to enable address generation), up/down control signals (e.g., a signal UPDOWN whose state indicates whether the address that is being generated is increasing with each clock cycle or is decreasing), etc.

Because the address generation capabilities of satellite address generators 68 are distributed within memory blocks 22, fewer routing resources are needed to implement built-in-self-test-circuit functionality (e.g., 80% fewer high-speed lines in some scenarios). Paths such as path 64 can therefore contain fewer high speed lines and can consume less area than lines 52 of FIGS. 4 and 5.

In the FIG. 6 arrangement, each memory block 22 may receive control signals for its satellite address generator 68 over path 64. The control signals may direct the satellite address generator 68 to perform desired address generation functions. In response, each satellite address generator 68 may locally generate address signals for addressing its associated memory block, while that memory block is simultaneously receiving data from data generator 62.

The output response analyzer circuitry 72 of each memory block may be used in locally detecting whether an error occurs during a test on that memory block. The failure analysis debug logic 72 of each block may be used in error debugging operations. Stalling logic in each block of failure analysis and debug logic 72 may be used in stalling a memory test and the associated addressing operations for that block when an error has been detected. Each failure analysis circuit may operate individually, so that a memory test stall in one memory block need not result in the interruption of memory block testing in other blocks. Because memory block addressing may be stalled individually in this way, it is possible for built-in-self-test circuitry 56 of FIG. 6 to run some memory block tests to completion, even in the presence of a stall that has halted memory block testing in another memory block.

When a memory test in a given memory block is stalled, failure information for that memory block is preserved. The arrangement of FIG. 9 in which memory block test can be individually stalled allows all memory block failure information on a given integrated circuit to be preserved without stopping the testing of memory blocks that do not contain errors. If multiple memory blocks fail during a test, individual failure information may still be collected from each of the failed blocks.

Figure 7:
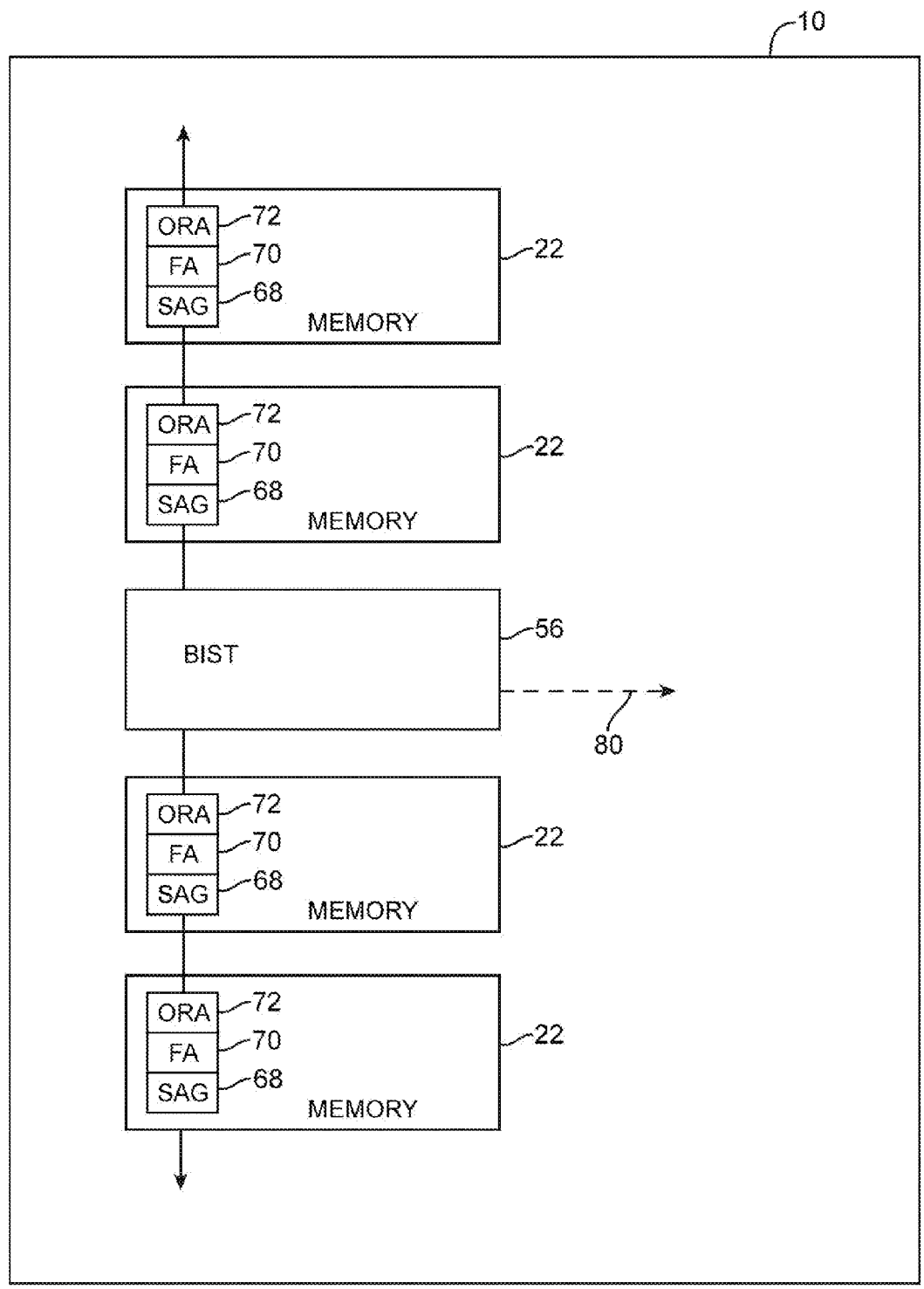
FIG. 7 is a diagram showing how a built-in-self-test circuit may distribute signals to multiple memory blocks for local processing using localized memory test circuitry such as localized output response analyzer circuitry, failure analysis circuitry, and satellite address generator circuitry in accordance with an embodiment of the present invention.

FIG. 7 shows how a built-in-self-test circuit such as built-in-self-test circuit 56 of FIG. 6 may be centrally located on integrated circuit. In the FIG. 7 example, built-in-self-test circuit 56 is being used to test memory blocks 22 that are arranged in a column including memory blocks both above and below circuit 56. Other arrangements may also be used. For example, built-in-self-test circuitry 56 may be used in testing memory blocks 22 that are arranged in both horizontal and vertical dimensions. As shown schematically by dashed line 80 in FIG. 7, built-in-self-test circuitry may be connected to memory blocks 22 at different horizontal locations on integrated circuit 10.

Figure 8:
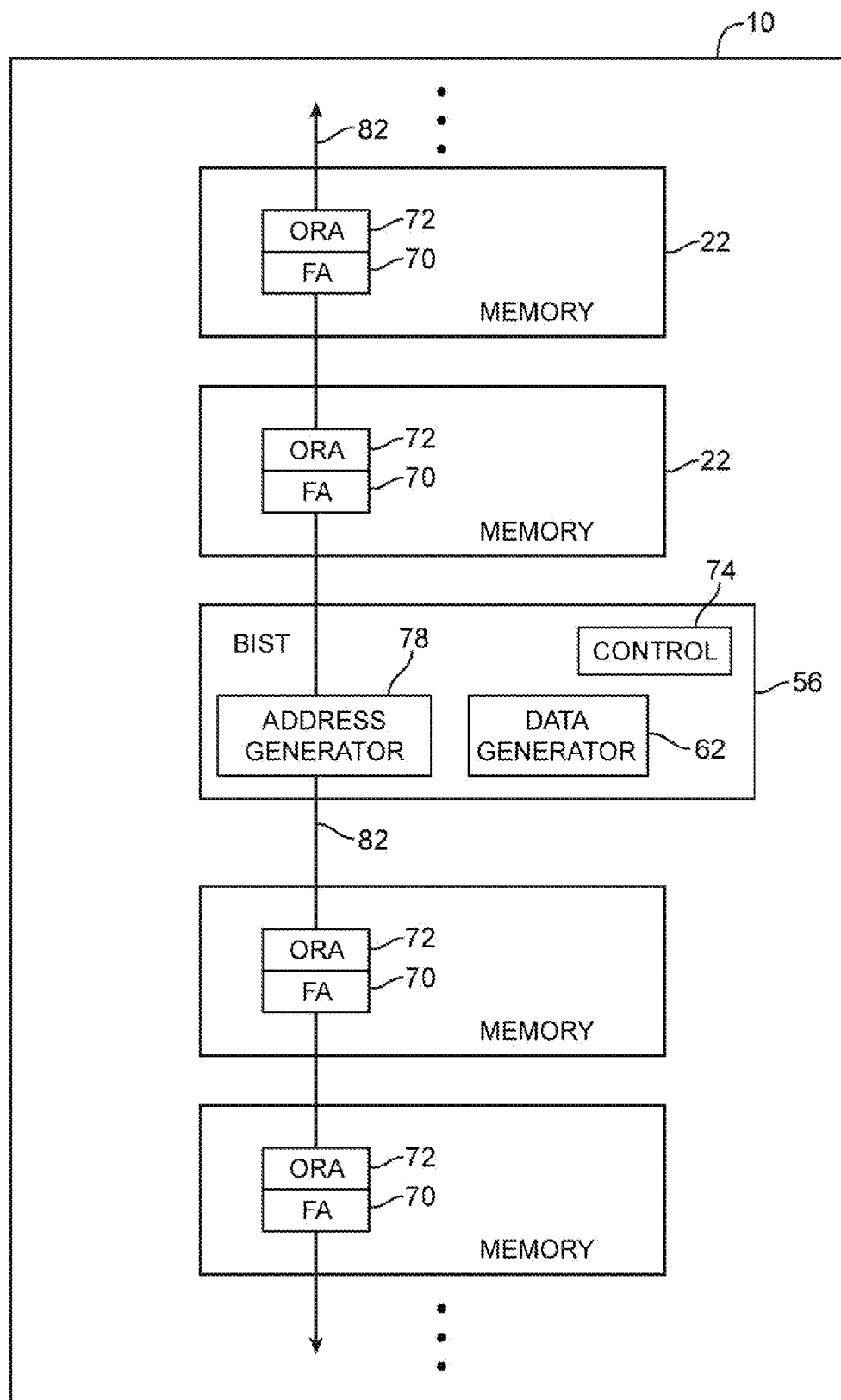
FIG. 8 is a diagram showing how a built-in-self-test circuit with centralized address generation capabilities may distribute address signals to multiple memory blocks while relying on local processing performed by local output response analyzer circuitry and local failure analysis circuitry to perform memory tests in accordance with an embodiment of the present invention.

FIG. 8 shows an illustrative arrangement for built-in-self-test circuitry 56 in which built-in-self-test circuitry 56 includes an address generator. Address generator 78 in circuitry 56 may be used to generate memory block addresses for memory blocks 22 during testing while data generator 62 provides test data to each of the memory blocks under the control of control circuitry 74.

To accommodate address distribution functions in the arrangement of FIG. 8, path 82 may include address lines that distribute undecoded binary address information to each of memory blocks 22. The amount of routing resources that are conventionally used to relay failure analysis data from the memory blocks to the built-in-self-test circuit may be reduced by providing each memory block 22 in the FIG. 8 configuration with local testing resources such as output response analyzer 72 and failure analysis and debug logic 70. Because these resources are provided in each memory block 22, fewer bus lines (and therefore less area on the integrated circuit) may be required to support communications between memory blocks 22 and built-in-self-test circuit 56 than will conventional arrangements of the types shown in FIGS. 4 and 5.

Figure 9:
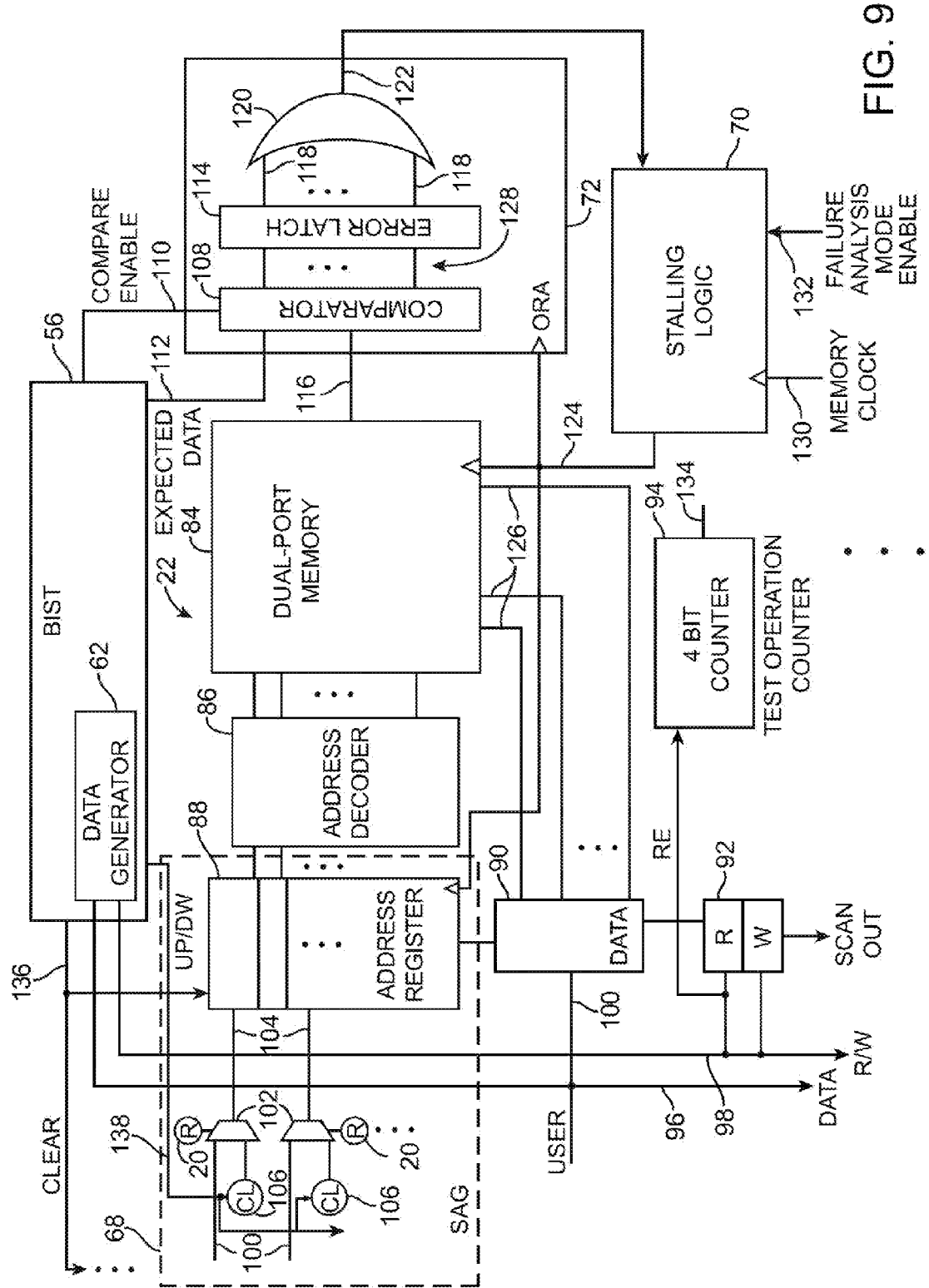
FIG. 9 is a diagram of an illustrative built-in-self-test circuit that may be used in testing multiple blocks of memory on an integrated circuit and that has the ability to locally stall memory tests so that memory tests can be performed independently on each of the blocks of memory in accordance with an embodiment of the present invention.

FIG. 9 shows a circuit implementation that may be used for built-in-self-test circuitry on an integrated circuit 10 that contains multiple memory blocks 22 to be tested. Each memory block 22 may have an array of random-access-memory such as dual-port memory block 84. Address decoder 86 may receive undecoded binary address signals from address register 88 and may provide corresponding decoded address signals on the address lines of memory 84. Data lines 126 may be used to convey test data to array 84 from data register 90. During testing, test data is loaded into data register 90 from data generator 62 via paths 96 and 100. Data generator 62 may also provide control signals such as a read/write control signal for read-write register 92 using path 98. Registers such as address register 88, data register 90, and read/write control register 92 may be connected with similar circuitry in other memory blocks and elsewhere on integrated circuit 10 to form a scan chain. The data in the scan chain can be accessed by data analysis circuitry (e.g., to analyze test results) by placing the circuitry of integrated circuit 10 in scan mode and scanning out the register contents.

Data may be read from memory array 84 using data lines (e.g. data lines such as lines 126). As shown schematically in FIG. 9, memory array 84 may supply output signals to output response analyzer 72 via path 116. Output response analyzer 72 may have a comparator such as comparator 108. Built-in-self-test circuitry 56 can enable and disable comparator 108 using comparator enable line 110. During testing, built-in-self-test circuitry 56 can place memory 88 in read mode by asserting the read/write enable signal on path 98. Circuitry 56 can also supply expected test data values to comparator 108 via path 112. If, for example, a data "1" was written into a particular array location, this "1" value may be conveyed to comparator 108 via path 112. Comparator 108 may compare the actual data value read from array 84 to the expected data from path 112 and may generate resulting outputs on path 128. If the expected data and actual data match, comparator 108 may generate a first logic value (e.g., a logic low), whereas comparator 108 may generate a second logic value (e.g., a logic high) whenever the expected data and actual data do not match. With this type of scheme, logic high signals on the output of comparator 108 are indicative of detected memory errors. Error latch 114 may store the output signals from comparator 108 and may provide these signals to OR gate 120 via paths 118. OR gate 120 will take line 122 high whenever any of the comparator outputs goes high (i.e., whenever any part of memory array 84 exhibits an error).

Stalling logic 70 may receive a memory clock on input 130 and a failure analysis enable signal on input 132. When no error is detected, stalling logic may distribute the memory clock received on line 130 to output path 134, to clock memory 22 normally. When failure analysis mode is enabled (e.g., the signal on line 132 has been asserted), stalling logic 70 will inhibit the memory clock signal on line 124 whenever the signal on line 122 goes high. Other types of stalling logic and output response analysis logic may be used if desired. The example of FIG. 9 is illustrative.

Built-in-self-test circuitry 56 may be used to perform write and read operations on array 84. During write operations, test data is loaded. During read operations, memory array 84 is addressed at the same location to which data was written and the contents of the addressed memory location is read out to determine whether the test data was stored properly.

The test patterns that are used during testing depend on the memory architecture used for memory block 22 and the design of the memory cells within block 22. Examples of test patterns include patterns of all logic ones, all logic zeros, checkerboard patterns of ones and zeros, etc. Defects that may be revealed through testing include stuck-at-one faults in which a cell becomes stuck at a logical one value (e.g., a high signal such as Vcc), stuck-at-zero faults in which a cell becomes stuck at a logical zero value (e.g., a low or ground signal such as Vss), and coupling faults in which a cell's content is improperly influenced by the content of adjacent cells. Effective debugging and yield enhancement requires that these faults be identified and located in each memory block 22. If, for example, a row of stuck-at-one faults is identified, it may be necessary to change the layout of a power supply line (as an example). Producing a diagram of the faults (errors) in memory block 22 may make it easier to identify failure signatures, i.e., single bit, cluster of neighboring bits, row, column, etc. A failure signature can guide the next required actions (electrical or physical) to determine the root cause of a failure. The results of the analysis can dictate the follow-on actions taken to mitigate the reoccurrences of the failure. These can be changes to the circuit design, manufacturing process, or testing process.

In a typical test, built in self test circuitry 36 asserts a write enable signal to place memory 22 in write mode. Using data generator 62 and the satellite address generator 68 in each memory block 22, built in self test circuitry 56 may systematically step through all of the memory addresses of interest for memory 22. The memory addresses may be used multiple times in ascending and descending directions while test data is simultaneously loaded data test patterns of appropriate bit lengths into memory 84.

Tests are sometimes referred to based on the number of times each memory location is tested (the number of "march steps" in the test). For example, a test in which each memory location is visited ten times is sometimes called a "10n" test, whereas a test in which each memory location is visited twenty times is sometimes called a "20n" test.

Tests may also be described using "march element" notation. Consider, as an example, a march element of (w1, r1, w0, and r0). In this illustrative march element (which would generally be part of a much larger overall memory test), each entry corresponds to a different test operation. The "w1" test operation involves writing a data "1" into memory. The "r1" test operation involves performing a read operation where the expected value of the stored data is "1." Similarly, "w0" refers to writing a "0" and "r0" refers to a test operation where it is expected that a "0" will be read from the array.

Because memory blocks can be individually stalled, it is desirable to keep a count of which test operation was being performed when an error is detected by output response analyzer 72. This allows the analyzing circuitry of circuit 10 (and/or off-chip test analysis circuitry) to identify the type of test that failed and thereby facilitate debugging.

If desired, each memory block may be provided with a counter such as counter 94. Counter 94 may be, for example, a 4-bit counter. Counter 94 may serve as a march element test operation counter that keeps track of which test operation in a given march element was being performed when an error is detected. Counter 94 may be incremented in response to receipt of the read/write enable signal received from path 99. When a memory test is stalled, counter 94 is also stalled and the contents of counter 94 may be examined to identify the test operation that lead to the detected failure. The contents of counter 94 may be read out using output path 134, part of a scan chain, or any other suitable path.

Satellite address generator 68 may include configurable circuitry such as programmable counter and multiplexer circuitry that allows a counter to be selectively formed using the registers of address register 88. The counter may be formed to provide circuitry for systematically generating a series of undecoded binary addresses to supply to the input of address decoder 86. As shown in FIG. 9, built-in-self-test circuitry 56 may provide a reset (CLEAR) signal to address register 88 via path 136. The signal CLEAR may be used to clear the contents of register 88. Built-in-self-test circuitry 56 may also supply an UP/DW (up-down) control signal on path 138 to control the direction in which binary address counting proceeds. The signal on line 138 may be routed to the control inputs of counting logic 106. Counting logic 106 may be coupled to the inputs of multiplexers 102. Multiplexers 102 may have control inputs that receive static control signals from associated control bits (configuration RAM bits) stored in associated programmable elements 20. Each multiplexer may have an output 104 that is coupled to the input of an associated address register latch in address register 88. Multiplexers 102 each have first and second inputs that can be selectively routed to a corresponding output. When configured in a first state, the multiplexers route addresses from inputs 100 to address register 88 (e.g., to support normal user-mode operations). When configured for testing, counter logic 106, multiplexers 102, and the registers of address register 88 form a counter that generates addresses for memory 22 in a sequential fashion in accordance with the selected count direction from the control signal on line 138.

The test operation count maintained by test operation counter 94 may be used in identifying which test operation in a given march element was in effect when circuitry 72 and circuitry 70 detects a failure. When a given memory block is stalled, stalling may be performed in the same clock cycle in which an error is detected. The stalled address from the satellite address generator 68 in the stalled block may then be uploaded to tester 24 (FIG. 2). The contents of error latch 114 can also be scanned out using a scan chain or other path. The contents of the error latch may be used to identify the defective bit in the memory block that caused the detected failure.

To identify the test operation in the march element that caused the failure, the contents of test operation counter 94 may be provided to tester 24. Tester 24 or other external equipment (e.g., tool 30 of FIG. 2) or internal circuitry associated with built-in-self-test circuitry 56 may use this information in identifying the read operation at the point of failure. If desired, a software-based approach may be used for test failure identification (e.g., in circuit environments where it is not desired to incorporate a test operation counter such as counter 94 of FIG. 9). With a software approach, tester 24 may provide a test instruction (test vector) to integrated circuit 10. The test instruction may direct built-in-self-test circuitry 56 to disable comparator 108 during particular types of read operations, thereby isolating certain other types of read operations. As an example, comparator 108 may only be enabled when "R1" reads are performed and not when "R0" reads are performed. If, under these circumstances, an error is detected, it can be concluded that the error is of the "R1" type. This software approach may therefore be used in identifying errors without relying on counter 94.

When counter 94 is incorporated into memory block 22, the count of counter 94 can help identify the location of a test operation. Consider the march element (W1, R1, W0, R0). When testing, the count of counter 94 is incremented when performing test operation R1 and, again, when performing test operation R0. In a test with numerous march elements and test operations, the count value indicates how far the test progressed before the error was detected. If a failure is detected, the count value can therefore be used to determine which type of test operation was being performed when the error occurred.

Care should be taken to correct the count value when appropriate so that detected errors are detected properly. Typically, the read operation that feeds comparator 108 exhibits a one clock cycle latency with respect to the clock for address register 88. When identifying an error from the count of counter 94, tester 24 would therefore adjust the scanned out address value by one step (up or down depending on the direction in which satellite address generator 68 was operating when generating addresses for the test). In a multi-test-operation march element, it is not necessary to make address corrections, because each test operation has the same address (i.e., the address is not incremented until all of the test operations in the march element are complete). An exception to this rule arises when an error occurs in the last test operation of a march element where this last test operation is a read operation. In this particular situation, the comparator output will indicate that an error has been detected while the address has already changed in anticipation of performing the test operation at the beginning of a subsequent pass through the march element.

Figure 10:
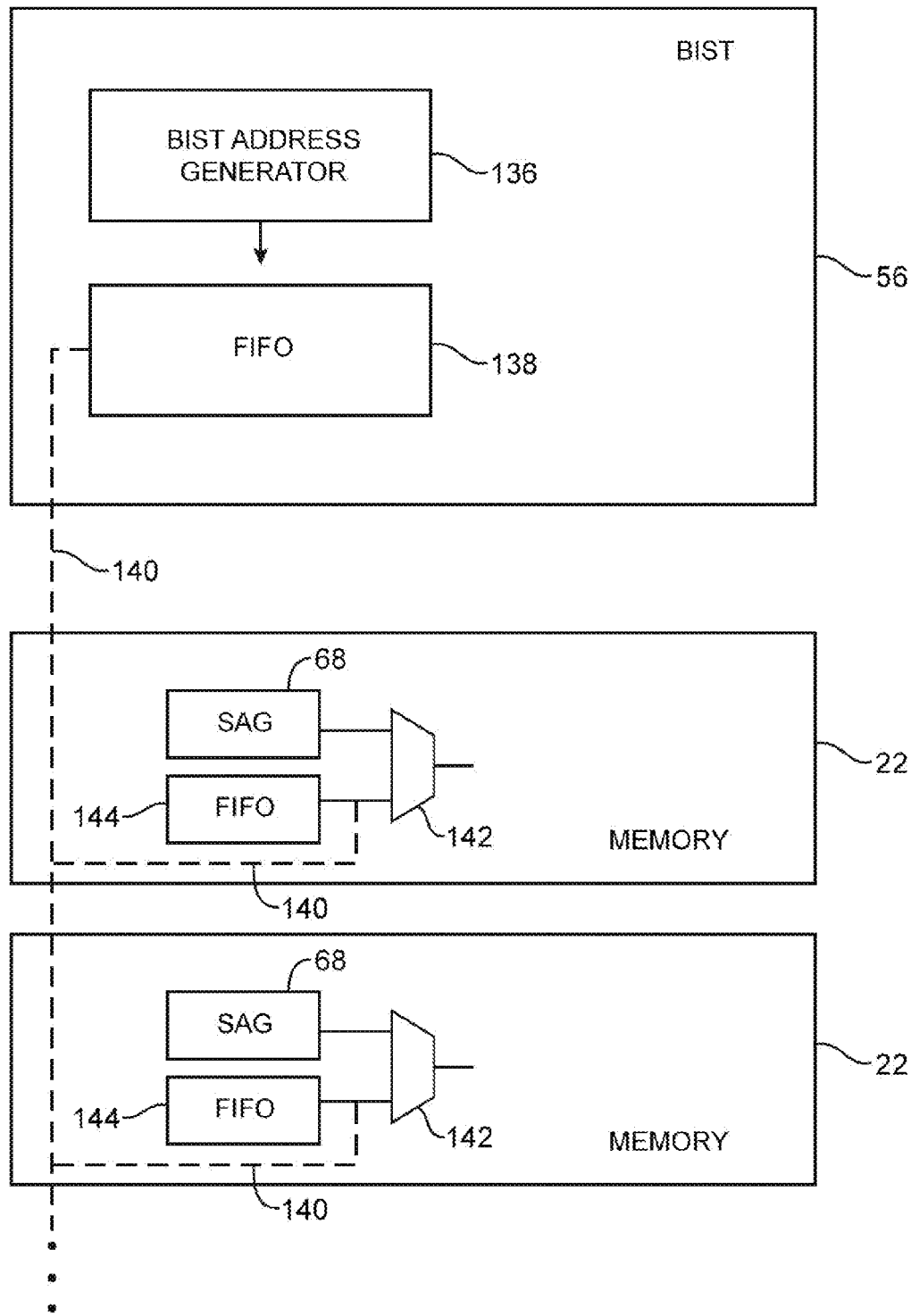
FIG. 10 is a diagram showing how memory blocks and built-in-self test circuitry may be provided with first-in-first output memory circuits for storing randomized memory testing address in accordance with an embodiment of the present invention.

If desired, randomized (customized and potentially out of order) addresses may be supported during testing. It may be desirable to be able to use randomized addresses to support user-defined addressing schemes or to avoid potential systematic inaccuracies that might arise from using purely sequential addresses. Randomized addressing may be supported by providing each memory block 22 with a address buffer 144 as shown in FIG. 10. The address buffer 144 (or other suitable storage) may be, for example, a first-in-first-out buffer. Test memory addresses may be stored in each address buffer 144. The same memory addresses may be stored in the buffer 144 of each block 22 or a different set of memory addresses may be stored in each block. During normal (non-randomized address) memory block testing, configurable multiplexers 142 may be adjusted to supply each memory block 22 with an address generated locally by an associated satellite address generator. It is generally more efficient to generate addresses using a satellite address generator than it is to provide these addresses with a address buffer. The use of satellite address generators to generate at least some of the addresses associated with a memory block test can therefore help to minimize the size of the address buffers and thereby reduce circuit area. When it is desired to use the addresses loaded into buffers 144, multiplexer 142 may be configured to route the contents of buffers 144 to the memory block. If desired, randomized addressing may be supported using a centralized buffer 138 (i.e., a common first-in-first-out buffer) that distributes addresses to each memory block 22 using a path such as path 140.

Figure 11:
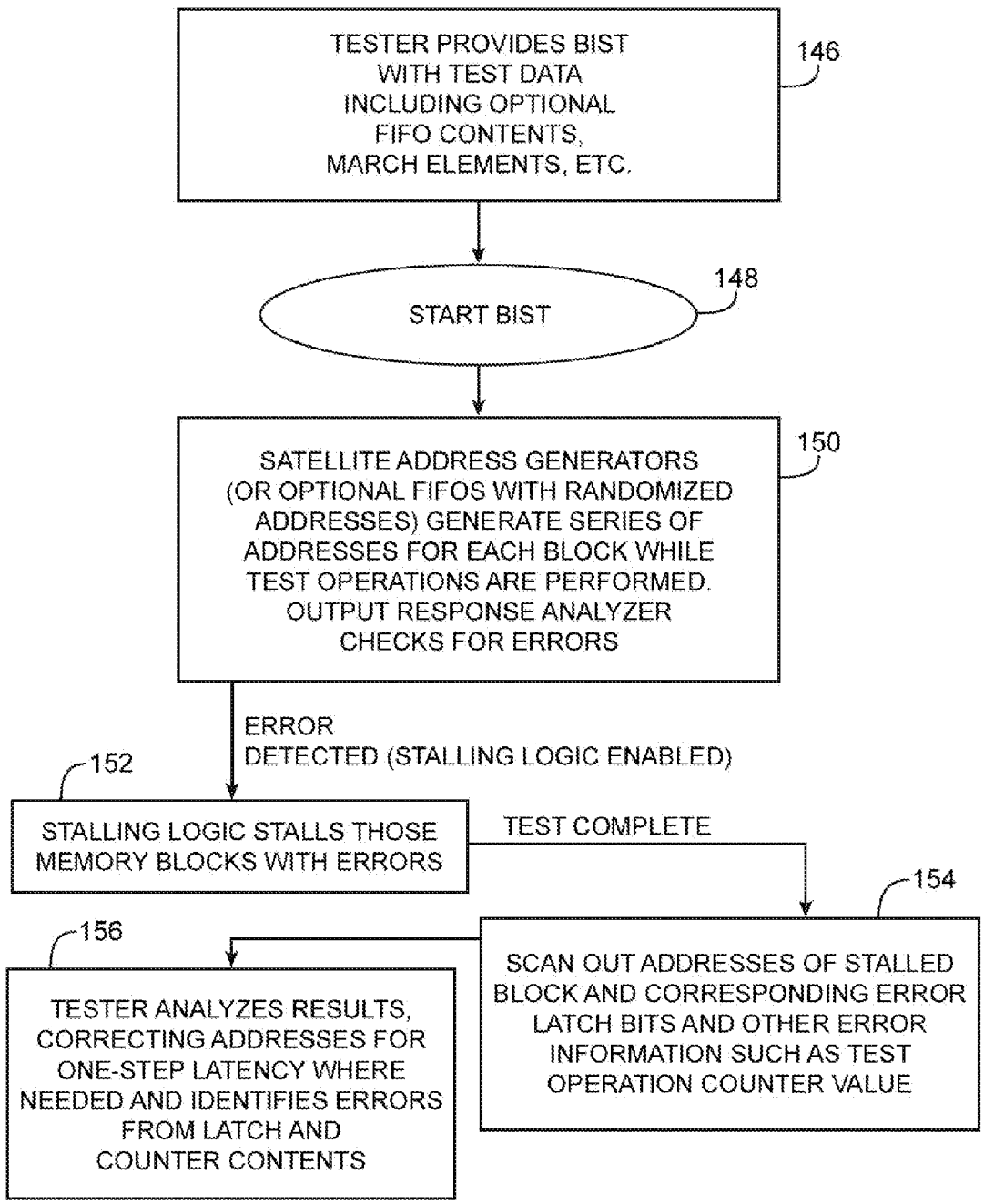
FIG. 11 is a flow chart of illustrative steps involved in performing memory block tests using built-in-self-test circuitry that contains memory block test stalling logic in accordance with an embodiment of the present invention.

Illustrative steps involved in using built-in-self-test circuitry 56 to test memory blocks 22 are shown in FIG. 11. As shown in FIG. 11, tester 24 may provide built-in-self-test circuitry 56 with test data during the operations of step 146. The test data may include information such as optional randomized address information for first-in-first-out (FIFO) buffers of the type described in connection with FIG. 10, information such as march element descriptions, etc.

The operation of built-in-self-test circuitry 56 to test memory blocks 22 may be initiated at step 148.

Once testing commences, each satellite address generator 68 may produce an associated set of test addresses to apply to an associated memory block (or an associated FIFO may produce randomized addresses based on user-supplied test addresses). At the same time, test data is generated and applied to the memory blocks. Counter circuitry such as counter 94 may be incremented while tests are performed. When an error is detected in a particular memory block, additional tests in that block may be stalled. Any suitable memory test stalling logic may be used to allow the stalling of test operations on a per-block basis. For example, stalling logic associated with failure analysis blocks 70 and output response analyzer blocks 72 may be used in identifying the occurrence of memory errors and taking appropriate actions.

The individual stalling of blocks that contain detected errors to prevent situations in which the contents of an error latch in a memory block is obscured is shown schematically in step 152. Although illustrative circuit configurations in which stalling logic that is associated with failure analysis blocks 70 and output response analyzer blocks 72 has been described herein, it will be appreciated that this is merely illustrative. Any suitable stalling logic may be used to implement memory stalling operations if desired. The stalling circuitry preferably allows failure analysis information to be extracted from the stalled block, so that the test results can be accurately analyzed. Memory stalling logic can be implemented using stand-alone logic, logic that is part of one or more blocks of circuitry such as failure analysis circuit blocks, circuitry that uses signals generated from an output response analyzer block or other control signal source, circuitry that uses other suitable circuit architectures, or combinations of these approaches. The circuit arrangements described herein are merely illustrative.

Once testing is complete, processing may proceed to step 154. During the operations of step 154, the addresses of the stalled blocks and the contents of their error registers may also be scanned out of circuit 10 using scan chains. Information on the contents of counter 94 and other error detection information may also be scanned out. The test data that is gathered in this way may be provided to tester 24 and diagnostic tool 30 or other suitable external computing equipment for evaluation (step 156). During the operations of step 156, the tester may identify which memory locations exhibited faults and the nature of those faults by examining the contents of counter 94 while accounting for the one-step latency between each test location and the value of address register 88.

In production testing (normal testing where only pass/fail is needed) the stalling feature is normally not activated, thus even when there is an error detected in the memory block, it will not stall, but will continue to run and accumulate errors in the error latch. At the end of the test, error latch contents are observed to determine pass/fail. When it is desired to collect failure information for debug or failure analysis, the stalling feature may be turned on using a control signal from a built-in-self-test block or other suitable technique. Once the feature is activated, it will perform the functions described above.

The foregoing is merely illustrative of the principles of this invention and various modifications can be made by those skilled in the art without departing from the scope and spirit of the invention.

What is claimed is:

1. An integrated circuit comprising:

built-in-self-test circuitry;

a plurality of memory blocks coupled to the built-in-self-test circuitry, wherein each memory block of the plurality of memory blocks includes a satellite address generator operable to generate memory addresses during testing of that memory block using the built-in-self-test circuitry; and a test operation counter in each memory block, wherein the test operation counter is operable to count march element test operations.

2. The integrated circuit defined in claim 1 wherein the built-in-self-test circuitry comprises a data generator operable to provide test data to each memory block of the plurality of memory blocks.

3. The integrated circuit defined in claim 2 wherein the built-in-self-test circuitry comprises a dummy address generator operable to provide data generator control signals to the data generator without providing address information to the memory blocks.

4. The integrated circuit defined in claim 2 wherein the built-in-self-test circuitry comprises address generator circuitry operable to provide data generator control signals to the data generator.

5. The integrated circuit defined in claim 1 further comprising:

memory test stalling logic in a memory block of the plurality of memory blocks for independently stalling testing in said memory block when an error is detected in said memory block during memory block testing.

6. The integrated circuit defined in claim 5 wherein a memory block of the plurality of memory blocks includes an error latch associated therein for identifying error locations within said memory block.

7. The integrated circuit defined in claim 5 wherein a memory block of the plurality of memory blocks includes an output response analyzer for detecting errors for the stalling logic in said memory block.

8. An integrated circuit comprising:

built-in-self-test circuitry;

a plurality of memory blocks coupled to the built-in-self-test circuitry, wherein each memory block of the plurality of memory blocks includes an address generator operable to generate memory addresses during testing of that memory block using the built-in-self-test circuitry, wherein the address generator is separate from the built-in-self-test circuitry;

configurable circuitry that includes counting logic and address register circuitry in each memory block, wherein the configurable circuitry of each memory block is selectively configured to implement a portion of the address generator; and programmable elements operable to supply static output control signals that selectively configure the configurable circuitry to implement the portion of the address generator.

9. The integrated circuit defined in claim 8 further comprising conductive paths coupling the built-in-self-test circuitry to the plurality of memory blocks, wherein the built-in-self-test circuitry is operable to provide test data to each of the plurality of memory blocks over the conductive paths.

10. The integrated circuit defined in claim 9 further comprising:
a logic component in a memory block of the plurality of memory blocks for stalling the testing in said memory block responsive to detecting an error within the memory block.

11. The integrated circuit defined in claim 10 wherein a memory block of the plurality of memory blocks has an output response and includes analyzer circuitry for analyzing said output response to detect errors for the stalling logic in that memory block.

12. The integrated circuit defined in claim 11 wherein the analyzer circuitry includes an error latch and logic circuitry interposed between the error latch and the logic component.

13. The integrated circuit defined in claim 8 wherein the built-in-self-test circuitry comprises a data generator for providing test data to a memory block of the plurality of memory blocks.

14. The integrated circuit defined in claim 13 wherein the built-in-self-test circuitry further comprises address generator circuitry for providing data generator control signals to the data generator.

15. A method of performing memory block tests on an integrated circuit that contains built-in-self-test circuitry and a plurality of memory blocks, wherein each memory block comprises address decoder circuitry, the method comprising:
with a satellite address generator in each memory block, locally generating memory test addresses during memory testing; and
while the memory test addresses are being generated, providing test data to each memory block of the plurality of memory blocks from a common memory test data generator.

16. The method defined in claim 15 wherein providing the test data comprises:
generating the test data with a data generator in a built-in-self-test circuit on the integrated circuit; and
transmitting the test data to the memory blocks.

17. The method defined in claim 16 wherein generating the test data with the data generator comprises:
providing control signals to the data generator with an address generator in the built-in-self-test circuit.

18. The method defined in claim 15 further comprising:
in response to detecting an error in a given memory block, identifying error locations in that memory block with an error latch in that memory block.

19. The method defined in claim 15 further comprising:
in response to detecting an error in a given memory block, independently stalling testing in that memory block with a logic component in that memory block.

20. The method defined in claim 19, wherein the given memory block has an output response and wherein detecting an error in the given memory block comprises detecting the error for the logic component in that memory block with associated analyzer circuitry that analyzes the output response.

* * * * *